US010283436B2

(12) United States Patent
Schuderer et al.

(10) Patent No.: US 10,283,436 B2
(45) Date of Patent: May 7, 2019

(54) POWER ELECTRONICS MODULE WITH FIRST AND SECOND COOLERS

(71) Applicant: ABB Schweiz AG, Baden (CH)

(72) Inventors: Juergen Schuderer, Zürich (CH); Fabian Mohn, Ennetbaden (CH); Didier Cottet, Zürich (CH); Felix Traub, Rheinfelden (CH); Daniel Kearney, Zürich (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/783,193

(22) Filed: Oct. 13, 2017

(65) Prior Publication Data

US 2018/0040538 A1     Feb. 8, 2018

Related U.S. Application Data

(63) Continuation of application No. PCT/EP2016/052161, filed on Feb. 2, 2016.

(30) Foreign Application Priority Data

Apr. 13, 2015   (EP) ..................... 15163368

(51) Int. Cl.
*H01L 23/473*     (2006.01)
*H01L 25/07*      (2006.01)
(Continued)

(52) U.S. Cl.
CPC ........ *H01L 23/473* (2013.01); *H01L 23/3142* (2013.01); *H01L 23/49844* (2013.01);
(Continued)

(58) Field of Classification Search
CPC ... H01L 23/473; H01L 23/3143; H01L 24/48; H01L 23/49844; H01L 24/49; H01L 25/071; H01L 29/1608
See application file for complete search history.

(56) References Cited

U.S. PATENT DOCUMENTS 7,940,526 B2 *  5/2011  Schulz-Harder ...... H01L 23/473
                                                    165/104.33
8,264,087 B2 *  9/2012  Chung .................. H01L 23/498
                                                    257/706
(Continued)

FOREIGN PATENT DOCUMENTS

DE        4103486 A1    8/1992
EP        1148547 A2    10/2001
(Continued)

OTHER PUBLICATIONS

European Patent Office, International Search Report & Written Opinion issued in corresponding Application No. PCT/EP2016/052161, dated Apr. 7, 2016, 9 pp.
Europen Patent Office; International Preliminary Report on Patentability issued in corresponding Application No. PCT/EP2016/052161, dated Jun. 26, 2017, 7 pp.
(Continued)

*Primary Examiner* — William Coleman
(74) *Attorney, Agent, or Firm* — J. Bruce Schelkopf; Taft Stettinius & Hollister LLP

(57) ABSTRACT

A power electronics module comprises a first liquid cooler comprising a cooling channel for receiving a cooling liquid, wherein the first liquid cooler comprises a metal body providing a first terminal of the power electronics module; a second liquid cooler comprising a cooling channel for receiving a cooling liquid, wherein the second liquid cooler comprises a metal body providing a second terminal of the power electronics module; a plurality of semiconductor chips arranged between the first liquid cooler and the second liquid cooler, such that a first electrode of each semiconductor chip is bonded to the first liquid cooler, such that the first electrode is in electrical contact with the first liquid cooler, and an opposite second electrode of each semiconductor chip is in electrical contact with the second liquid cooler; and an insulating encapsulation, formed by molding the first liquid cooler, the second liquid cooler and the plurality of semiconductor chips into an insulation material,
(Continued)

such that the first liquid cooler, the second liquid cooler and the plurality of semiconductor chips are at least partially embedded onto the insulation material.

20 Claims, 4 Drawing Sheets

(51) Int. Cl.
*H01L 23/31* (2006.01)
*H01L 23/498* (2006.01)
*H01L 23/00* (2006.01)
*H01L 29/16* (2006.01)

(52) U.S. Cl.
CPC .............. *H01L 24/48* (2013.01); *H01L 24/49* (2013.01); *H01L 25/071* (2013.01); *H01L 29/1608* (2013.01); *H01L 2224/33* (2013.01); *H01L 2224/48091* (2013.01)

(56) References Cited

U.S. PATENT DOCUMENTS

| | | | | |
|---|---|---|---|---|
| 8,482,921 | B2* | 7/2013 | Cai | ..................... F28D 15/0266 |
| | | | | 165/104.26 |
| 9,287,193 | B2* | 3/2016 | Orimoto | ................. H01L 24/33 |
| 2010/0090335 | A1 | 4/2010 | Chung | |
| 2014/0291832 | A1 | 10/2014 | Schwarz | |

FOREIGN PATENT DOCUMENTS

| | | |
|---|---|---|
| EP | 2270855 A1 | 1/2011 |
| FR | 2754669 A1 | 4/1998 |
| WO | 2014158481 A1 | 10/2014 |

OTHER PUBLICATIONS

European Patent Office, Extended Search Report issued in corresponding Application No. 15163368.2, dated Oct. 5, 2015.

* cited by examiner

POWER ELECTRONICS MODULE WITH FIRST AND SECOND COOLERS

FIELD OF THE INVENTION

The invention relates to the field of packaging of high power semiconductors. In particular, the invention relates to a power electronics module and to a power cell for an electrical converter.

BACKGROUND OF THE INVENTION

Wide bandgap semiconductor devices, for example based on SiC substrates can provide higher maximal blocking voltages as comparable devices based on Si substrates. The higher maximum blocking voltage in combination with lower switching losses of SiC semiconductor devices allows more flexibility of converter design for medium voltage and high voltage applications.

For example, the entire voltage range of MV applications may be covered with simple two-level voltage source converter topologies. Higher switching frequencies may reduce the total harmonic distortion significantly.

For typical two level or three level topologies in high voltage applications, the number of semiconductors in series connection may be reduced drastically. This also may reduce the number of gate drivers and the number of stacked coolers and modules.

For modular multilevel converters or cascaded half-bridge topologies in high voltage applications, the number of converter cells may be reduced drastically. Again, this may reduce the number of gate drivers and the number of stacked coolers and modules. Furthermore, the volume of the entire converter may be reduced significantly.

In addition, high voltage SiC devices may provide a higher cosmic ray robustness.

Furthermore, SiC devices will allow high temperature and high-current operation and may potentially allow a significant shrinkage of SiC area and power module footprint.

Finally, modular multilevel converter and cascaded half-bridge topologies for high voltage applications based on SiC may lower the need for short circuit failure mode (SCFM) operation.

However, due to the different design and operation properties of wide bandgap semiconductor devices compared to Si devices, there may be a need for new packaging concepts for assembling these devices into modules.

For example, compared to conventional Si semiconductor devices, SiC devices have smaller chip area and may consequently have lower current ratings, which may require paralleling of an even larger number of devices.

Furthermore, high loss densities may require advanced heat spreading and cooling. In addition, very low or even negative temperature coefficients of resistance of SiC bipolar devices may demand highly uniform temperature resistances across parallel bipolar devices.

Higher operation voltages may require higher protection for partial discharges at substrate metallization edges. For example, sharp DBC (direct bonded copper substrate) Cu edges and active metal brazing protrusions with curvatures in the micrometer range may lead to considerable field crowding and are of particular concern at ultra-high voltage applications. Higher edge termination surface fields may result in a need for enhanced insulation strength and excluded contamination and moisture condensation in the vicinity of the edge termination.

Faster switching capabilities may result in higher transients and there may be a need for synchronous switching of a large multitude of parallel devices.

US 2014/0291832 A1 relates to a power semiconductor module with an IGBT and a diode interposed between two DBC (direct copper bonding) substrates and molded into a mold compound. Two cooling shells are bonded to the substrates.

EP 2 270 855 A1 relates to a double-side cooled module with two substrate plates and semiconductor components between the two substrate plates.

DE 41 03486 A1 shows a cooling arrangement with a semiconductor device mounted between two liquid cooled electrodes. The semiconductor device is arranged in an opening of an isolating plate, which is arranged between the two electrodes.

DESCRIPTION OF THE INVENTION

It is an object of the invention to provide a power electronics module that considers the different design and operation properties of wide bandgap switching devices. For example, such a power electronics module provides good cooling capabilities in combination with enhanced electrical insulation, which is usually needed by wide bandgap devices.

This objective is achieved by the subject-matter of the independent claims. Further exemplary embodiments are evident from the dependent claims and the following description.

An aspect of the invention relates to a power electronics module, which for example may be used for high-voltage DC (HVDC) applications and/or for high and medium voltage power converters. The term "power electronics" may refer to electronic devices adapted for switching currents of more than 100 A and/or more than 1.000 V. Medium voltage may be a voltage between 1.000 V and 20.000 V. High voltage may be a voltage higher than 20.000 V.

According to an embodiment of the invention, the power electronics module comprises a first and a second liquid cooler, a plurality of semiconductor chips between the coolers and an (electrically) insulating encapsulation into which the coolers and the chips are at least partially embedded.

The first liquid cooler comprises a cooling channel for receiving a cooling liquid, wherein the first liquid cooler comprises a metal body providing a first terminal of the power electronics module. Also the second liquid cooler comprises a cooling channel for receiving a cooling liquid, wherein the second liquid cooler comprises a metal body providing a second terminal of the power electronics module. In general, each of the coolers may comprise a cavity inside its metal body, which is used for conducting the cooling liquid. Furthermore, each of the coolers may provide connections or plugs for connecting one or more cooling conduits with the respective cooler.

It may be possible that an intermediate cooler is arranged between the first and second cooler, wherein a first layer of semiconductor chips are arranged between the first and the intermediate cooler and a second layer of semiconductor chips is arranged between the intermediate cooler and the second cooler. Such a double stacked module may be useful with respect to providing a half-bridge within one module.

One, two or all of the coolers may be based on fins, micro-channels, mini-channels and/or impingement structures providing very low and uniform thermal resistance across parallel semiconductor chips. Mini-channels may be channels with a diameter of about 100 μm to 1 mm. Micro-channels may be channels with a diameter of about less than 100 μm. An impingement structure may comprise spray or jet cooling of a liquid onto a surface to be cooled. It also may be possible that the cooling liquid evaporates inside one or both of the coolers (flow boiling).

The plurality of semiconductor chips are arranged between the first liquid cooler and the second liquid cooler, such that a first electrode of each semiconductor chip is bonded to the first liquid cooler. In such a way, the first electrode is in electrical contact with the first liquid cooler, and an opposite second electrode of each semiconductor chip is in electrical contact with the second liquid cooler. For example, each opposite electrode may be in contact via electrically conducting posts with the second cooler or with the intermediate cooler.

The coolers may have metal bodies with substantially plate-like shapes. The semiconductor chips may be arranged side by side (in parallel rows and/or columns) between two of the coolers. Since the semiconductor chips are directly bonded to the first cooler, partial discharges from metallization edges of a substrate (such as a DBC substrate) may be avoided.

The first and the second cooler may provide terminals of the power electronics module. A current may enter the module via the metal body of the first cooler, which distributes the current to the first electrodes of the semiconductor chips, and may leave the module through the metal body of the second cooler (or vice versa). It has to be understood that the coolers are not electrically insulated from the semiconductor chips.

The encapsulation is formed by molding the first liquid cooler, the second liquid cooler and the plurality of semiconductor chips into an insulation material, such that the first liquid cooler, the second liquid cooler and the plurality of semiconductor chips are at least partially embedded onto the insulation material. For example, the assembly of coolers and bonded chips may be placed into a mold and cast into a solidifying insulation material. For example, the space between the coolers accommodating the chips may be completely filled with the insulation material.

According to an embodiment of the invention, the first cooler, the second cooler and/or the intermediate cooler are embedded into the insulation material, such that only the terminals and cooling liquid connections protrude from the insulation material. Furthermore, the plurality of semiconductor chips is completely embedded into the insulation material. In other words, substantially all of the components of the power electronics module may be embedded into the insulation material. In particular, more than 90% of the metal surfaces of the coolers and all of the chips may be embedded into the insulation material. In such a way, the module may provide very good electrical insulation, which may be even suited for high voltage application and may provide very good cooling, since the chips are in direct thermal contact with the metal bodies of the coolers.

According to an embodiment of the invention, the first cooler comprises cavities into which the semiconductor chips are bonded. Also the intermediate cooler, when present, may comprise such cavities at a side directed to the second cooler. For example, such cavities may be machined into the metal body of the respective cooler. The cavities may help to reduce a width of the entire module and/or to allow a low-profile gate wirebond to a substrate. Furthermore, the cavities may help to align the chips with respect to each other and/or with respect to the cooler.

However, it also may be possible that the first (and/or the intermediate cooler) have a substantially planar surface at the side of the chips and that the chips are bonded to this planar surface with the respective planar electrode.

According to an embodiment of the invention, semiconductor chips are bonded to posts protruding from the second liquid cooler and/or the intermediate cooler. These posts may be a part of the metal body of the respective liquid cooler, i.e. may be of the same material as the respective cooler. It also may be possible that the posts are bonded to the respective liquid cooler.

Since the semiconductor chips are directly bonded to the next liquid cooler, also partial discharges from metallization edges of a substrate (such as a DBC substrate) may be avoided. Due to the wire bond-less topside of the second electrode of the chips, the chips also may be cooled from the topside. Furthermore, due to the posts, the module may have an improved short-circuit withstand capability.

As described, the chips and/or posts may be bonded to a cooler. In this context, bonding may mean any method that is adapted for interconnecting the respective electrode with the cooler/post. For example, bonding may be soldering or sintering, such as pressure-less sintering, or transient liquid phase bonding.

According to an embodiment of the invention, the semiconductor chips carry wide bandgap semiconductor devices. For example, the semiconductor chips may be SiC diodes, transistors and/or thyristors. However, the semiconductor chips also may be Si, GaN or other semiconductor materials and it may also be possible different semiconductor materials are combined in hybrid approaches, e.g., Si and SiC.

It should be highlighted that module design also may be beneficial for Si and other semiconductors and is not limited to SiC. In addition, also low voltage Si or SiC semiconductors can be packaged in this module. For example, the module may be used for the converter of an electrical or hybrid vehicle, such as a car. In this EV/HEC application, the concept may be of particular interest since cost and reliability critical interconnects and packaging materials such as DBCs and baseplates may be eliminated.

According to an embodiment of the invention, the first liquid cooler and the second liquid cooler are aligned with at least one through-hole pin. For example, the metal bodies of the coolers may have through-holes substantially orthogonal to the extension of the one or two layers of semiconductor chips. Pins may be placed in the through-holes of the first cooler and the second and/or intermediate cooler and may be plugged with its through-holes on the pins, which may align the first cooler and the second and/or intermediate cooler with respect to the first cooler. Such an alignment might be used in particular if the topside posts of the semiconductors are a part of a topside cooler.

According to an embodiment of the invention, the metal body of the first liquid cooler provides a planar first terminal protruding from the insulation material and the metal body of the second liquid cooler provides a planar second terminal protruding from the insulation material in an opposite direction, such that the power electronics module is stackable with an equally designed power electronics module for series connecting the power electronics module with the equally designed power electronics module. The planar terminals may be substantially parallel to an extension direction of the plate-shaped coolers and/or a layer of paralleled semiconductor chips. A tower of two or more of these series connected power electronics modules may be clamped together.

In this case, the insulation material may completely surround the coolers and the chips except the planar terminals.

According to an embodiment of the invention, beside a semiconductor chip with a gate electrode, a substrate comprising a metallization layer is bonded to the first liquid cooler such that the metallization layer is electrically isolated from the first liquid cooler, and the gate electrode is connected with a wire bond to the metallization layer. When an intermediate cooler is present, the side of the intermediate cooler facing the second cooler may be designed analogously.

For example, the substrate may be a DBC or PCB (printed circuit board) substrate, which is sintered or soldered with one metallization layer to the first cooler and which provides a second metallization layer, which is electrically insulated from the first cooler. The gate electrode, which may be arranged on the same side of the chip as the second electrode, may be connected with one or more wire bonds with the metallization layer. It also may be possible that more than one gate electrode of more than one chip are connected to the same metallization layer.

According to an embodiment of the invention, a spring, electrically connected to a gate terminal, is electrically insulated attached to the second liquid cooler and is pressed on the metallization layer. The gate terminal may be provided on the second cooler and/or the intermediate cooler at a side facing the first cooler. On the gate terminal, a spring for each metallization layer is provided, which is pressed on the metallization layer, when the second and/or intermediate cooler is put on the first cooler.

The substrate with the metallization layer, the gate terminal between the coolers and/or the springs may be completely embedded into the insulation material of the encapsulation.

Alternatively, a gate terminal rod is guided through the second liquid cooler and/or the intermediate cooler, such that it electrically contacts the metallization layer. In this case, the gate terminal may be provided on the outside of the second and/or intermediate cooler. According to an embodiment of the invention, a gate controller, which is connected to the gate terminal rod, is positioned on the encapsulation.

According to an embodiment of the invention, the first liquid cooler and/or the second cooler provide more than one terminal protruding at opposite sides from the power electronics module. For example, it may be possible that terminals of the module extend from the module substantially parallel to an extension direction of the plate-shaped coolers and/or the layer of semiconductor chips. It may be possible that at more than one side, terminals extend from the module. In an intermediate area (between the terminals), the coolers may be embedded into the insulation material of the encapsulation.

According to an embodiment of the invention, the first liquid cooler and the semiconductor chips are arranged inside a terminal cage formed of the second liquid cooler and a terminal plate arranged in parallel to the first liquid cooler and the second liquid cooler. It may be possible that the second cooler and the terminal plate form a cage of electrical conductors around the first cooler (and optionally the intermediate cooler) as well as the semiconductor chips. This may be seen as a coaxial terminal arrangement. This arrangement may enable more hard and/or more synchronous switching with respect to other arrangements of terminals and/or chips.

For forming the electrically conducting cage, the second liquid cooler and the terminal plate may be interconnected via lateral connection plates. For example, at all sides of the module, the first liquid cooler and the terminal plate may be interconnected with connection plates.

According to an embodiment of the invention, at least one of the liquid coolers of the power electronics is made from copper, aluminum, AlSiC, molybdenum and/or alloys of these materials. The metal body of the liquid cooler, which may contain the cooling channel as cavities and/or which may provide the terminals may be one piece. For example, the cooler may be casted from aluminum or copper together with the cooling channel, the cavities for the chips and/or the posts.

According to an embodiment of the invention, the power electronics module further comprises a housing accommodating the liquid coolers and the semiconductor chips embedded in the insulation material, herein the housing is filled with an explosion mitigating material (such as sand) surrounding the liquid coolers and the semiconductor chips. One or several power electronics modules may be placed in an explosion-proof box to prevent open arcing and/or shattering of parts.

A further aspect of the invention relates to a half-bridge power electronics module, which is based on the design of the power electronics module.

According to an embodiment of the invention, the half-bridge module comprises the first liquid cooler providing a first DC terminal, the second liquid cooler providing a second DC terminal and the intermediate liquid cooler comprising a cooling channel for receiving a cooling liquid, wherein the intermediate liquid cooler comprises a metal body providing an AC terminal of the power electronics module. A first layer of semiconductor chips is bonded to the first liquid cooler and in electrical contact with the intermediate liquid cooler via electrically conducting posts. Furthermore, a second layer of semiconductor chips is bonded to the intermediate liquid cooler and in electrical contact with the second liquid cooler via electrically conducting posts.

The semiconductor chips of the first layer (which may be transistors and/or thyristors) may provide a first leg of the half-bridge. The semiconductor chips of the second layer (which may be transistors and/or thyristors) may provide a second leg of the half-bridge. The coolers may provide the AC and DC terminals of the half-bridge.

Such a stacked dual configuration may enable a synchronous switching of all semiconductor chips of one layer. Furthermore, the stacked dual configuration may be combined with a coaxial terminal arrangement as described above, which also may enhance the switching capabilities of the half-bridge module.

A further aspect of the invention relates to a power cell for an electrical converter, such as a modular and/or multi-level converter.

According to an embodiment of the invention, the power cell comprises at least one capacitor and at least one power electronics module as described in the above and in the following, which is mounted to the capacitor. The liquid coolers and the semiconductor chips embedded in a solid insulation material may allow for compact arrangement of power modules and nearby converter parts. Such power modules may be directly mounted to a DC link capacitor or to a cell capacitor.

For example, the capacitor may provide terminals to which the terminals of the power module are directly connected. There may be no need for busbars or comparable conductors for electrical connecting the power electronics module to the capacitor. This also may result in a lower inductance of the electrical connection between the capacitor and the power electronics module, which may have advantages with respect to transients and switching speed.

These and other aspects of the invention will be apparent from and elucidated with reference to the embodiments described hereinafter.

BRIEF DESCRIPTION OF THE DRAWINGS

The subject-matter of the invention will be explained in more detail in the following text with reference to exemplary embodiments which are illustrated in the attached drawings.

The reference symbols used in the drawings, and their meanings, are listed in summary form in the list of reference symbols. In principle, identical parts are provided with the same reference symbols in the figures.

DETAILED DESCRIPTION OF EXEMPLARY EMBODIMENTS

Figure 1:
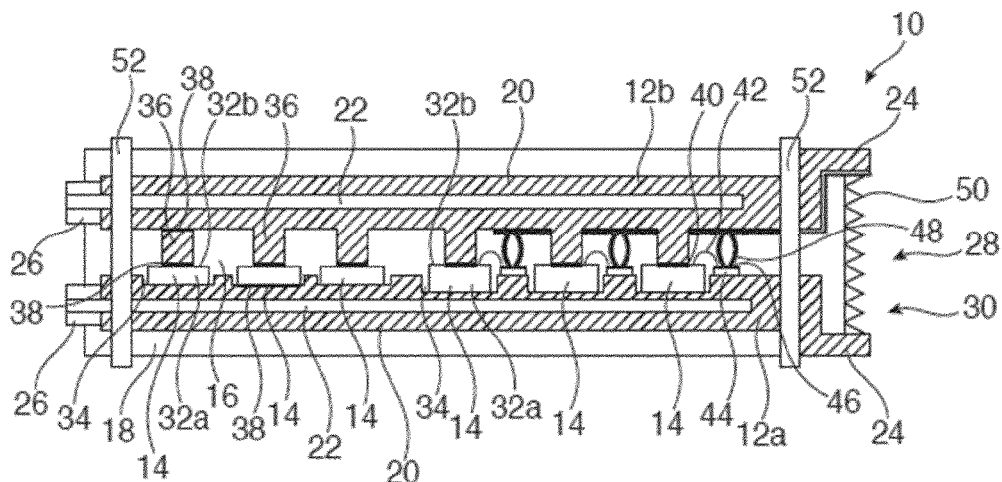
FIG. 1 schematically shows a cross-sectional view of a power electronics module according to an embodiment of the invention.

FIG. 1 shows a power electronics module 10 comprising a first liquid cooler 12a, a second liquid cooler 12b and a plurality of semiconductor chips 14 interposed between the coolers 12a, 12b. The semiconductor chips 14 and the coolers 12 are embedded into an insulation material 16, which forms an encapsulation 18 of the power electronics module 10.

Each of the coolers 12a, 12b has a metal body 20, for example formed of copper or aluminium, which contains a cooling channel 22. The metal body 20 has a substantially plate-like shape and (in FIG. 1 on one side of the power electronics module 10) provides a terminal 24 of the power electronics module 10. On the other side, a cooling connection or plug 26, which may be made of plastics material, is attached to the metal body 20, which protrudes from the insulation material 16. The metal body 20 of the cooler 12a, 12b, except the terminal 24, is embedded into the insulation material 16.

The saw-tooth line at the side of the terminals indicates a surface pattern 28 in the insulation material for increasing the creeping distance between the terminals 24.

The metal body 20 of the coolers may have a width (orthogonal to the plate extension of the metal body 20) from about 1 to 2 cm, to avoid that arcing erosion can reach the cooling liquid.

The coolers 12a, 12b may have a ceramic protection layer or plastics coating inside the cooling channel 20 and/or on the outside surface to manipulate the position of an arc.

The coolers 12a, 12b may be based on fins, mini-channels (about 100 μm to 1 mm), micro-channels (smaller than 100 μm) and/or impingement structures for de-ionized water. For very high heat resistance homogeneity requirements, the cooling channels 20 may be either arranged in a normal liquid flow configuration and/or may be designed for evaporative boiling with a suitable heat transfer liquid. If high cooling performance is required, an impingement cooling approach may be considered, in which cooling liquid may be sprayed onto a cooling zone with nozzles. The cooling connections or plugs 26 and/or the power terminals 24 may be connected to separate bus systems.

In FIG. 1, the chips 14, which may be diodes, transistors or thyristors based on a SiC substrate or a Si substrate, are arranged in a layer 30, which is substantially parallel to the extension of the plate-like shaped metal bodies 20 of the coolers 12a, 12b. The chips 14 may be arranged in rows and columns, i.e. in two dimensions.

Each of the chips 14 has a body with a planar first electrode 32a one side and a planar second electrode 32b on an opposite side.

The first electrode 32a is bonded (sintered or soldered) to a surface of the first cooler 12a. As indicated in FIG. 1, the first cooler 12a may have cavities or depressions 34, in which the chips 14 are accommodated. These cavities may help in aligning many chips 14, in adjusting different chip heights (for example switch and diode), and to allow a low-profile gate wirebond to a substrate. For example, the cavities 34 may be machined into the metal body 20 of the cooler 12a and after that, the chips 14 may be sintered into the cavities 34.

In FIG. 1 parallel connected free-wheeling diodes and parallel connected switches (transistors or thyristors) are shown, which have different heights that are compensated by cavities 34 of different depths.

The second electrode 32b of each chip is bonded to a post 36 that may be part of the metal body 20 (for example a machined part) of the cooler 12b or may be bonded to the cooler 12b. When the post 36 is a separate part, it may be firstly bonded to the chip 14 and then bonded to the cooler 12b. The posts 36 may be made of copper (Cu), aluminum (Al) or molybdenum (Mo). The connection with the posts 36 is scalable with voltage, longer posts 36 may be used for higher voltages. The posts may be made out of Al or an Al plate may be provided between the chips 14 and the posts 36 to allow SCFM (short circuit failure mode) formation for Si semiconductor chips 14 (i.e. a formation of a low-resistance Si/Al alloy under short circuit failure).

Since the chips 14 are directly mounted to the cooler 12a and to the cooler 12b via posts that also may provide good thermal conductivity, the cooling path is decoupled from the insulation path. The cooling performance is scalable to ultra-high voltage application.

It is possible to add a Mo buffer plate 38 between the chip 14 and the post 36 and/or the post 36 and the cooler 12b. Also the electrode 32a may be protected with a Mo buffer plate 38. These buffer plates 38/buffer layers may improve the match of the thermal extension coefficient to SiC, for example to reduce stress during thermal cycling.

The chips 14 are parallel connected with their electrodes 32a by the first cooler 12a and with their electrodes 32b by the second cooler 14b. A current may enter the power electronics module 10 through one of the terminals 24, is distributed by one of the coolers 12a, 12b to the parallel connected chips 14 and may be collected by the other one cooler 12a, 12b leaving the power electronics module though the other terminal 24.

Since the chips 14 are directly connected to the coolers 12a, 12b, which are also used for current conduction, DBC substrates for interconnecting the chips 14 with the coolers 12a, 12b may be avoided and thus partial discharges that may be generated by sharp metallization edges. To further reduce partial discharges, edges of the coolers 12a, 12b may be rounded.

Furthermore, the present design may provide improved surge current withstand capability due to the large area contacts at both sides of the chips 14 and the high thermal masses (the metal bodies 20) attached with a low thermal resistance.

Gate connections for switches, i.e. chips 14 with gate electrodes 40, may be realized with bond wires 42. Besides the corresponding chip 14 (and/or besides the corresponding cavity 34), a substrate 44 with a metallization layer 46 may be attached (glued, bonded, sintered or soldered). The gate electrode 40 of one or more chips 14 may be connected with wire bonds 42 with the metallization layer 46. For example, the substrate 44 may be arranged as collection line beside a row of chips 14.

The metallization layer 46 of the substrate 44 may be contacted by one or more springs 48, which are attached to the cooler 12b. The springs 48 may be electrically connected to a gate terminal 50 attached to the cooler 12b, such as an insulated board like a PCB or a metallized flex foil like Cu/Polyimide. In such a way, a low-inductance and/or symmetric gate connection across parallel chips 14 may be realized.

The coolers 12a, 12b may have through-holes substantially orthogonal to the extension of the plate-shaped metal bodies 20 and the layer 30 of chips 14. Through these through-holes, pins 52 may extend, which are used for aligning and/or fixing the coolers 12a, 12b with respect to each other.

The chips 14, coolers 12a, 12b are embedded in a solid insulation material 16, for example in a compression mold compound and/or a transfer mold compound. The insulation material 16 may have a coefficient of thermal expansion (CTE) matched to the material of the coolers 12a, 12b (such as Cu or Al). Due to this CTE match, warpage issues after molding may be avoided.

Besides the terminals 24 and the connections 26, all parts of the power electronics module 10 may be solid insulated, for example also the springs 48, the substrates 44 and most of the gate terminal 50. This may allow for compact arrangement of several power modules 10 and nearby converter parts as well as novel converter integration approaches since creepage and air striking distances may be largely reduced.

The insulation material 16 may be an epoxy mold compound, which may have a significantly lower moisture diffusion coefficient as a silicone gel so that issues of moisture penetration to the edge termination may be improved.

The insulation material 16 also may be a silicone rubber. Material softness may help to avoid shattering of parts under short circuit conditions. It is also possible to combine a soft and hard insulation material in the module 10 in order to direct over-pressure gas along the soft material towards a venting area of the module 10 or converter.

Figure 2:
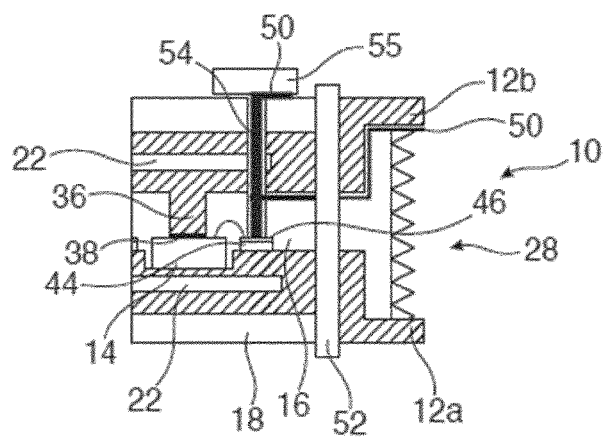
FIG. 2 schematically shows a cross-sectional view of a part of power electronics module according to a further embodiment of the invention.

FIG. 2 shows a part of power electronics module 10 with an alternative gate connection. In this case, the cooler 12b has through-holes, in which gate terminal rods 54 are guided through the cooler 12b, such that the rods 54 electrically contacts the metallization layer 46. These rods 54 may be connected to a gate terminal on topside of the cooler 12b or may be contacted between the coolers 12a, 12b to a gate terminal 50 that is attached to the inside of the cooler 12b. The other parts of the module 10 of FIG. 2 may be equally designed as described with respect to FIG. 1.

Furthermore, it may be possible that a gate controller 55 (for example comprising a printed circuit board with control and optionally protection components) connected to the gate terminal rod 54 is positioned on the encapsulation 18. The gate controller 55 may be positioned very close to the rod 54 on top of the power module 10. Since the cooler 12b may then be inbetween the gate controller 55 and the semiconductor chips 14, a good thermal decoupling may be achieved. In this way there may be no issue of high-T semiconductor operation as for example enabled by SiC and a low-temperature rating of control electronic components of the gate controller 55.

Figure 3:
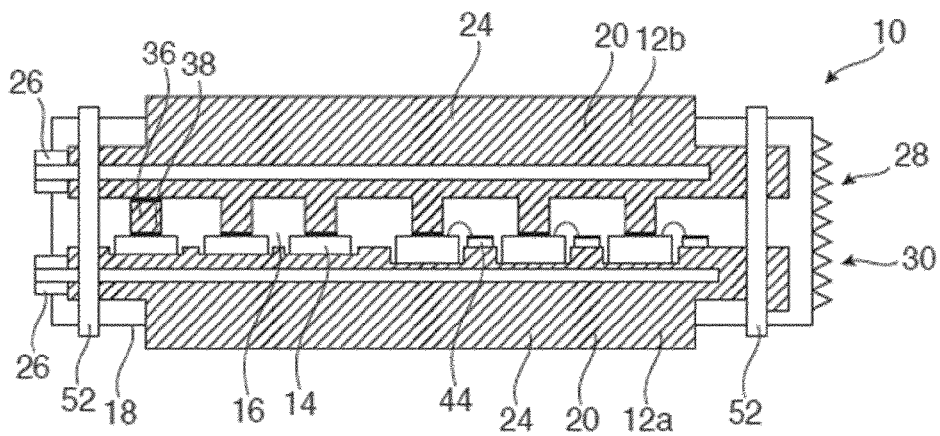
FIG. 3 schematically shows a cross-sectional view of a power electronics module according to a further embodiment of the invention.

FIG. 3 shows a further embodiment of a power electronics module 10 that has planar terminals 24' on sides of the module 10, which extend substantially on the same direction as the layer of chips 14 and/or the plate-like shaped coolers 12a, 12b. The planar terminals 24' may protrude from the insulation material 16, which may completely embed all other parts of the coolers 12a, 12b in opposite directions.

For series connection, two or more of such a module 10 may be stacked on each other and may be clamped together. The other parts of the module 10 of FIG. 3 may be equally designed as described with respect to FIGS. 1 and/or 2.

Figure 4:
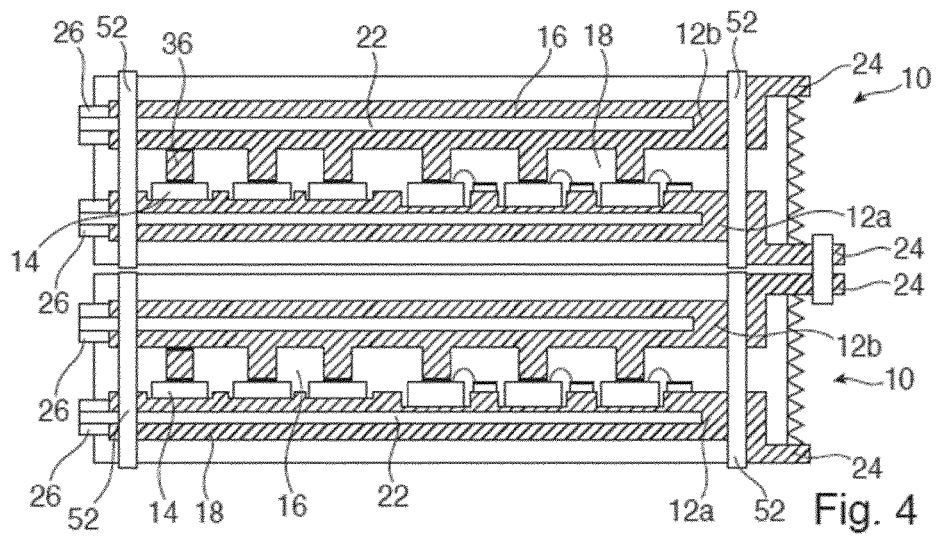
FIG. 4 schematically shows a cross-sectional view of two stacked power electronics module according to an embodiment of the invention.

FIG. 4 shows that two power electronics modules 10 according to FIG. 1 may be stacked together without clamping. The modules 10 may have planar sides (which may be provided by the encapsulation 18) and may be stacked on each other. For series connection the modules 10, the terminal 24 provided by the cooler 12b of the lower module 10, leaving the encapsulation on top, may be interconnected with the terminal 24 provided by the cooler 12a of the upper module, leaving the encapsulation at the bottom. No mechanical clamping of modules 10 is needed.

Figure 5:
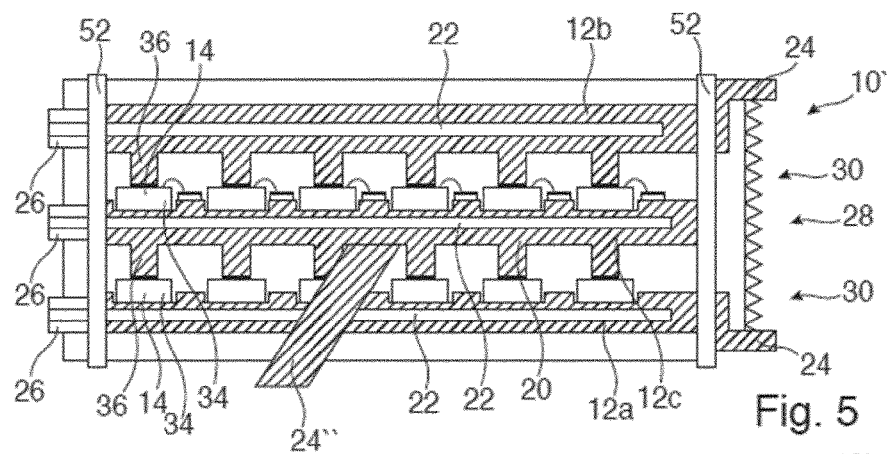
FIG. 5 schematically shows a cross-sectional view of a half-bridge module according to an embodiment of the invention.

FIG. 5 may provide a half-bridge composed of two modules 10. The outer terminals 24 are then the DC terminal. The two connected inner terminals 24 are then the AC terminal of the half-bridge.

FIG. 5 shows a half-bridge module 10' that comprises an intermediate cooler 12c between the coolers 12a, 12b. Between the first cooler 12a and the intermediate cooler 12c, a first layer 30 of chips is arranged and between the intermediate cooler 12c and the second cooler 12b, a second layer 30 of chips is arranged. The coolers 12a, 12b are designed like in the previous figures.

The side of the intermediate cooler 12c facing the cooler 12a is designed like the side of the cooler 12b facing the chips 14 and the side of the intermediate cooler 12c facing the cooler 12b is designed like the cooler 12a facing the chips 14.

The cooling channel 22 of the intermediate cooler 12c may be designed like the one of the coolers 12a 12b.

Also the intermediate cooler 12c may be aligned and/or fixed with the through-hole rods 52.

The layers 30 of chips each provide a leg of a half-bridge that is integrated into the module 10'. The terminals 24 provided by the coolers 12a, 12b are DC terminals of the half-bridge. Each of the layers 30 of chips 14 are connected in parallel by the intermediate cooler 12c, which also provides an AC terminal 24' of the half-bridge.

The dual configuration of FIG. 5 may allow for a thinner construction compared to FIG. 4 and therefore may have a lower loop inductance.

Figure 6:
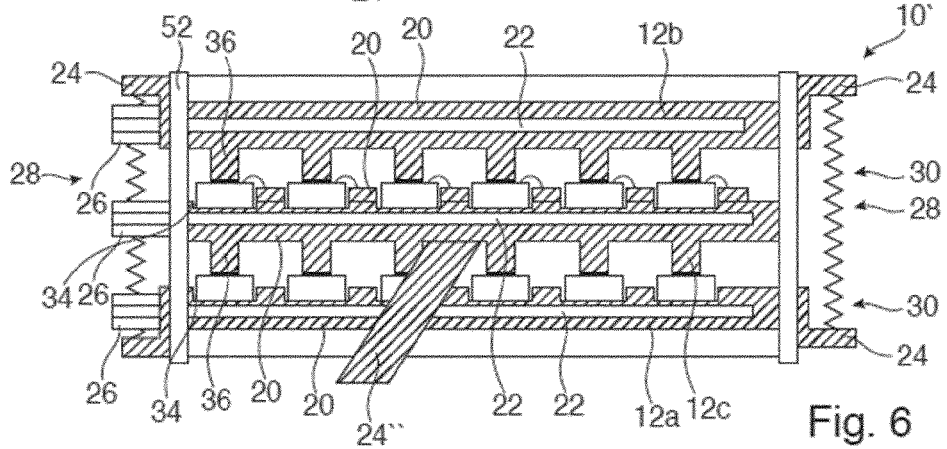
FIG. 6 schematically shows a cross-sectional view of a half-bridge module according to a further embodiment of the invention.

FIG. 6 shows a half-bridge module 10', with terminals 24 on both sides of the encapsulation 18. A plurality of terminals 24 may be positioned around the periphery of the module 10 for symmetric connection. Also the embodiment of FIGS. 1 to 4 may be provided with such terminals 24. Such an arrangement of terminals 24 may equalize the impedances between the terminals 24 and the chips 14.

Figure 7:
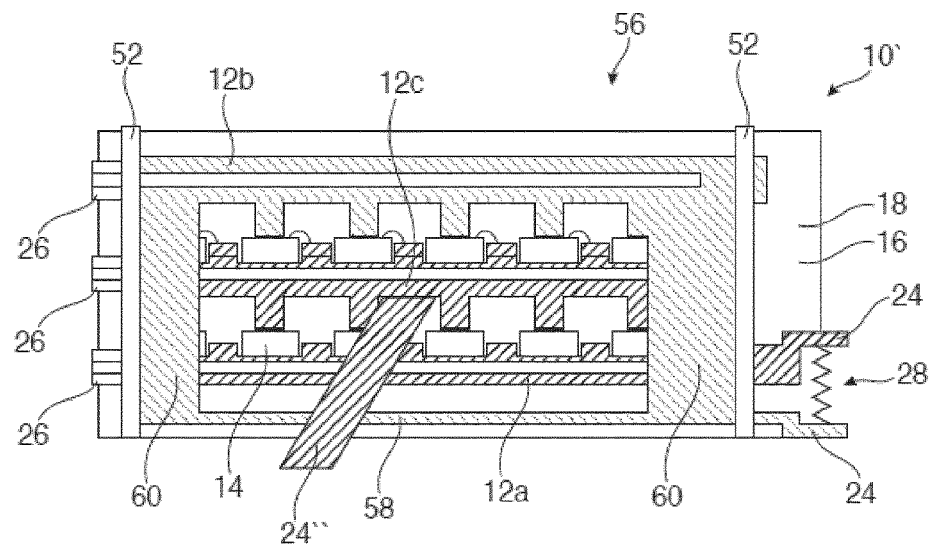
FIG. 7 schematically shows a cross sectional view of a half-bridge module according to a further embodiment of the invention.

FIG. 7 shows a half-bridge module 10' in which the first cooler 12a, the intermediate cooler 12c and the chips 14 are arranged inside a terminal cage 56, which is composed of the second cooler 12b, a terminal plate 58 below (outside of) the first cooler 12a and lateral connection plates 60 interconnecting the terminal plate 58 and the second cooler 12b. The terminal 24 corresponding to the second cooler 12a is provided by the terminal plate 58.

FIG. 7 shows a perspective view of the coolers 12a, 12b, 12c, chips 14 and the terminal cage 56 of FIG. 7. The terminal cage 58 and the cooler 12a may be seen as a "coaxial" terminal arrangement, which may have a high loop inductance reduction and a more equalized terminal-to-chip impedance.

Except of the terminal cage 60, the module 10' of FIG. 7 may be designed like the module 10' of FIG. 5. Furthermore, it also is possible that the module 10 of FIGS. 1 and 2 with only one layer 30 of chips 14 is provided with a terminal cage 56 according to FIGS. 7 and 8.

Figure 8:
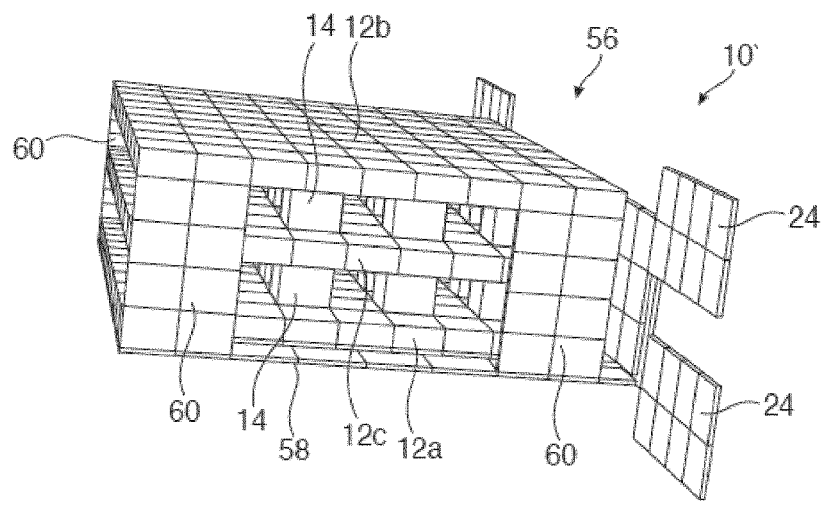
FIG. 8 schematically shows a perspective view of components of a half-bridge module according to a further embodiment of the invention.

In FIG. 8 it is further shown that the DC+ and DC− terminals 24 enter the module 10' in low inductive parallel plate configuration. The (upper) DC-cooler 12b is connected to the (bottom) DC-terminal plate 58 through a plurality of vertical plates 60 around the periphery of the module 10. In FIG. 8, two vertical plates 60 on each side of the module 10' are shown as example. However, it is possible that more than two plates 60 per side are provided.

Figure 9:
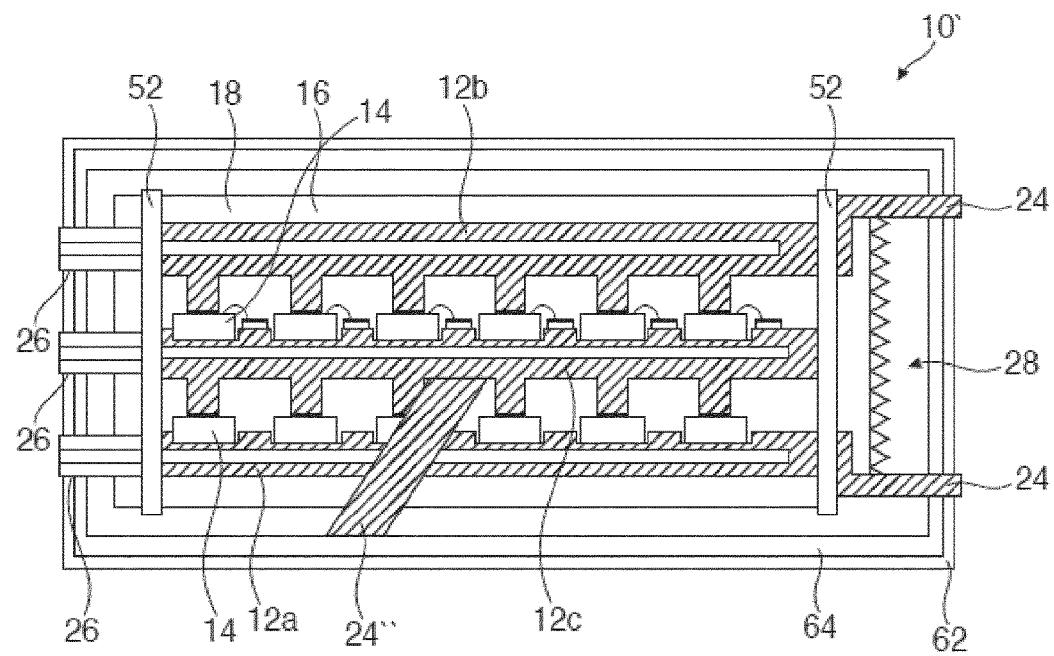
FIG. 9 schematically shows a cross-sectional view of a half-bridge module according to a further embodiment of the invention.

FIG. 9 shows that the half-bridge module 10' of FIGS. 5 to 8 may be arranged inside an explosion proof housing 62. The housing 62 also may be filled with an explosion mitigating material 64 such as sand. Only the terminal 24 and the connections 26 may penetrate to the outside of the housing 62.

It has to be understood that also a module 10 as described with respect to FIGS. 1 to 3 may be accommodated in a further housing 62 as described with respect to FIG. 9.

Figure 10:
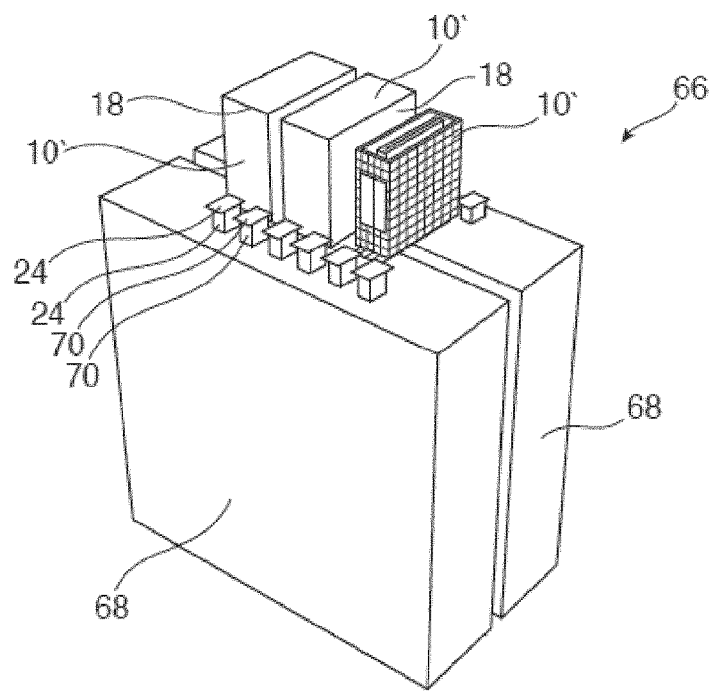
FIG. 10 schematically shows a perspective view of a converter power cell according to an embodiment of the invention.

FIG. 10 shows a converter power cell 66 with capacitors 68 and half-bridge modules 10'. One of the modules 10' is shown without its housing 18.

The half-bridge modules 10 are directly connected with their terminals 24 to the terminals 70 of the capacitors 68. No external bus bar is needed. It also may be possible to integrate the modules into the housing of the capacitors 68 in order to re-use the functionality of the capacitor housing (over-pressure venting, explosion-proof casing, etc).

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art and practising the claimed invention, from a study of the drawings, the disclosure, and the appended claims. In the claims, the word "comprising" does not exclude other elements or steps, and the indefinite article "a" or "an" does not exclude a plurality. A single processor or controller or other unit may fulfil the functions of several items recited in the claims. The mere fact that certain measures are recited in mutually different dependent claims does not indicate that a combination of these measures cannot be used to advantage. Any reference signs in the claims should not be construed as limiting the scope.

LIST OF REFERENCE SYMBOLS 10 power electronics module
12a cooler
12b cooler
14 semiconductor chip
16 insulation material
18 encapsulation
20 metal body
22 cooling channel
24 terminal
26 cooling connection
28 surface pattern
30 layer of chips
32a first electrode
32b second electrode
34 cavity
36 post
38 molybdenum plate
40 gate electrode
42 bond wire
44 substrate
46 metallization layer
48 spring contact
50 gate terminal
52 pin
54 gate terminal rod
55 gate controller
24' planar terminal
10' half-bridge module
12c intermediate cooler
24" AC terminal
56 terminal cage
58 terminal plate
60 connection plate
62 explosion proof housing
64 explosion mitigating material
66 converter cell
68 capacitor
70 terminal

The invention claimed is:
1. A power electronics module, comprising:
a first liquid cooler comprising a cooling channel for receiving a cooling liquid, wherein the first liquid cooler comprises a metal body providing a first terminal of the power electronics module;

a second liquid cooler comprising a cooling channel for receiving a cooling liquid, wherein the second liquid cooler comprises a metal body providing a second terminal of the power electronics module;

a plurality of semiconductor chips arranged between the first liquid cooler and the second liquid cooler, such that a first electrode of each semiconductor chip is bonded to the first liquid cooler such that the first electrode is in electrical contact with the first liquid cooler and an opposite second electrode of each semiconductor chip is in electrical contact with the second liquid cooler;

an insulating encapsulation, formed by molding the first liquid cooler the second liquid cooler and the plurality of semiconductor chips into an insulation material, such that the first liquid cooler the second liquid cooler and the plurality of semiconductor chips are at least partially embedded onto the insulation material.

2. The power electronics module of claim 1,
wherein the first cooler and the second cooler are embedded into the insulation material, such that only the terminals and cooling liquid connections protrude from the insulation material; and/or
wherein the plurality of semiconductor chips are completely embedded into the insulation material.

3. The power electronics module of claim 1, wherein the first cooler comprises cavities into which the semiconductor chips are bonded.

4. The power electronics module of claim 1,
wherein semiconductor chips are bonded to posts protruding from the second liquid cooler; and/or
wherein at least one of the posts is a part of the metal body of the second liquid cooler or at least one of the posts is bonded to the second liquid cooler.

5. The power electronics module of claim 1, wherein the semiconductor chips carry wide bandgap semiconductor devices.

6. The power electronics module of claim 1, wherein the first liquid cooler and the second liquid cooler are aligned with at least one through-hole pin.

7. The power electronics module of claim 1,
wherein the metal body of the first liquid cooler provides a planar first terminal protruding from the insulation material and the metal body of the second liquid cooler provides a planar second terminal protruding from the insulation material in an opposite direction, such that the power electronics module is stackable with an equally designed power electronics module for series connecting the power electronics module with the equally designed power electronics module.

8. The power electronics module of claim 1, wherein beside a semiconductor chip with a gate electrode, a substrate comprising a metallization layer is attached to the first liquid cooler such that the metallization layer is electrically isolated from the first liquid cooler, and the gate electrode is connected with a wire bond to the metallization layer.

9. The power electronics module of claim 1, wherein the first liquid cooler and/or the second liquid cooler provide more than one terminal protruding at opposite sides from the power electronics module.

10. The power electronics module of claim 1,
wherein the first liquid cooler and the semiconductor chips are arranged inside a terminal cage formed of the second liquid cooler and a terminal plate arranged in parallel to the first liquid cooler and the second liquid cooler;
wherein the second liquid cooler and the terminal plate are interconnected via lateral connection plates.

11. The power electronics module of claim 1, wherein at least one of the liquid coolers of the power electronics module is made from copper, aluminum, AlSiC, molybdenum and/or alloys of these materials.

12. The power electronics module of claim 1, further comprising:
a housing accommodating the liquid coolers and the semiconductor chips embedded in the insulation material;
wherein the housing is filled with an explosion mitigating material surrounding the liquid coolers and the semiconductor chips.

13. The power electronics module of claim 2, wherein the first cooler cavities into which the semiconductor chips are bonded.

14. The power electronics module of claim 2,
wherein semiconductor chips are bonded to posts protruding from the second liquid cooler; and/or
wherein at least one of the posts is a part of the metal body of the second liquid cooler or at least one of the posts is bonded to the second liquid cooler.

15. The power electronics module of claim 2, wherein the semiconductor chips carry wide bandgap semiconductor devices.

16. The power electronics module of claim 3,
wherein semiconductor chips are bonded to posts protruding from the second liquid cooler; and/or
wherein at least one of the posts is a part of the metal body of the second liquid cooler or at least one of the posts is bonded to the second liquid cooler.

17. The power electronics module of claim 3, wherein the semiconductor chips carry wide bandgap semiconductor devices.

18. The power electronics module of claim 8,
wherein a spring, electrically connected to a gate terminal, is electrically insulated attached to the second liquid cooler and is pressed on the metallization layer; or
wherein a gate terminal rod is guided through the second liquid cooler, such that it electrically contacts the metallization layer and/or a gate controller connected to the gate terminal rod is positioned on the encapsulation.

19. A half-bridge power electronics module, comprising:
a first liquid cooler comprising a cooling channel for receiving a cooling liquid, wherein the first liquid cooler comprises a metal body providing a first terminal of the power electronics module, the first liquid cooler providing a first DC terminal;
a second liquid cooler comprising a cooling channel for receiving a cooling liquid, wherein the second liquid cooler comprises a metal body providing a second terminal of the power electronics module, the second liquid cooler providing a second DC terminal;
a plurality of semiconductor chips arranged between the first liquid cooler and the second liquid cooler, such that a first electrode of each semiconductor chip is bonded to the first liquid cooler, such that the first electrode is in electrical contact with the first liquid cooler, and an opposite second electrode of each semiconductor chip is in electrical contact with the second liquid cooler;
an insulating encapsulation, formed by molding the first liquid cooler, the second liquid cooler and the plurality of semiconductor chips into an insulation material, such that the first liquid cooler, the second liquid cooler and the plurality of semiconductor chips are at least partially embedded onto the insulation material
an intermediate liquid cooler comprising a cooling channel for receiving a cooling liquid, wherein the intermediate liquid cooler comprises a metal body providing an AC terminal of the power electronics module;

a first layer of semiconductor chips bonded to the first liquid cooler and in electrical contact with the intermediate liquid cooler via electrically conducting posts; and a second layer of semiconductor chips bonded to the intermediate liquid cooler and in electrical contact with the second liquid cooler via electrically conducting posts.

20. A power cell for an electrical converter, the power cell comprising:

at least one capacitor;

at least one power electronics module mounted to the capacitor; the at least one power electronics module comprising:

a first liquid cooler comprising a cooling channel for receiving a cooling liquid, wherein the first liquid cooler comprises a metal body providing a first terminal of the power electronics module;

a second liquid cooler comprising a cooling channel for receiving a cooling liquid, wherein the second liquid cooler comprises a metal body providing a second terminal of the power electronics module;

a plurality of semiconductor chips arranged between the first liquid cooler and the second liquid cooler, such that a first electrode of each semiconductor chip is bonded to the first liquid cooler, such that the first electrode is in electrical contact with the first liquid cooler, and an opposite second electrode of each semiconductor chip is in electrical contact with the second liquid cooler;

an insulating encapsulation, formed by molding the first liquid cooler, the second liquid cooler and the plurality of semiconductor chips into an insulation material, such that the first liquid cooler, the second liquid cooler and the plurality of semiconductor chips are at least partially embedded onto the insulation material.

* * * * *